United States Patent [19]

Kawata et al.

[11] Patent Number: 5,338,363

[45] Date of Patent: Aug. 16, 1994

[54] CHEMICAL VAPOR DEPOSITION METHOD, AND CHEMICAL VAPOR DEPOSITION TREATMENT SYSTEM AND CHEMICAL VAPOR DEPOSITION APPARATUS THEREFOR

[75] Inventors: Yoshinobu Kawata; Toshihiko Minami, both of Fukuoka, Japan

[73] Assignee: Mitsubishi Denki Kabushiki Kaisha, Tokyo, Japan

[21] Appl. No.: 980,971

[22] Filed: Nov. 24, 1992

[30] Foreign Application Priority Data

Dec. 13, 1991 [JP] Japan .................................. 3-330328

[51] Int. Cl.$^5$ .............................................. C23C 16/00
[52] U.S. Cl. ................................. 118/725; 118/715; 118/733
[58] Field of Search ...................... 118/715, 725, 733

[56] References Cited

U.S. PATENT DOCUMENTS 5,000,113  3/1991  Wang ................... 118/715

FOREIGN PATENT DOCUMENTS 4142877  7/1992  Fed. Rep. of Germany .
63-142829  9/1988  Japan .
2-295116  12/1990  Japan .

OTHER PUBLICATIONS

Lueger (Technological Encyclopedia), 4th ed., vol. 16, p. 488, "Lexikon Der Technik", K. Schiefer.

*Primary Examiner*—Richard Bueker
*Attorney, Agent, or Firm*—Oblon, Spivak, McClelland, Maier & Neustadt

[57] ABSTRACT

In order to prevent deposition of a reaction byproduct on the peripheries of reaction gas introduction holes, an annular inert gas injection member having a number of inert gas injection holes is provided around the reaction gas introduction holes. An inert gas is injected from inert gas injection holes toward an exhaust passage. This inert gas promotes a flow of an exhaust gas from a reaction space and forcibly flows toward the exhaust passage. Thus, a reaction byproduct contained in the exhaust gas is not remarkably deposited in the vicinity of the peripheries of the reaction gas introduction holes but quickly discharged into the exhaust passage. Thus, the reaction byproduct is hardly deposited around the reaction gas introduction holes.

21 Claims, 16 Drawing Sheets

F I G . 12
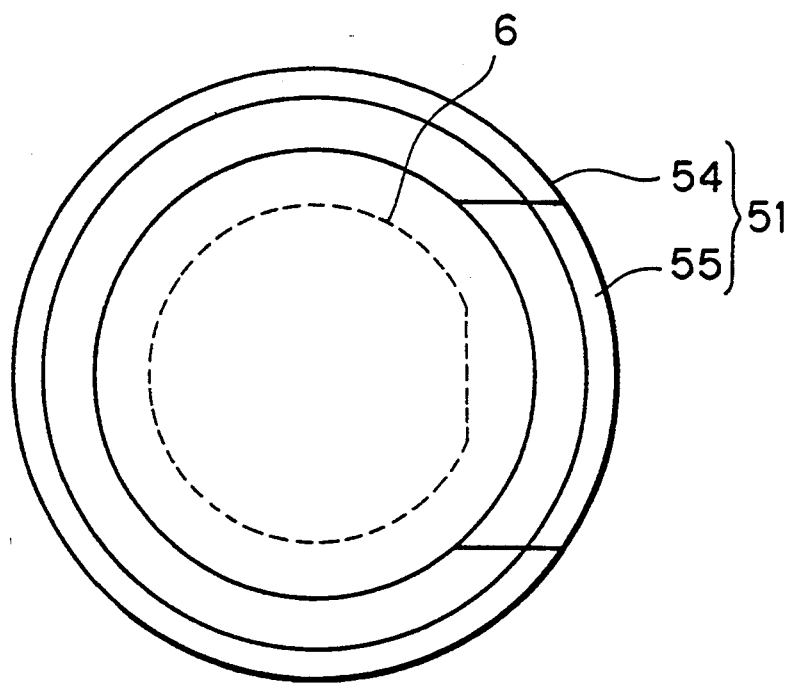
F I G . 13
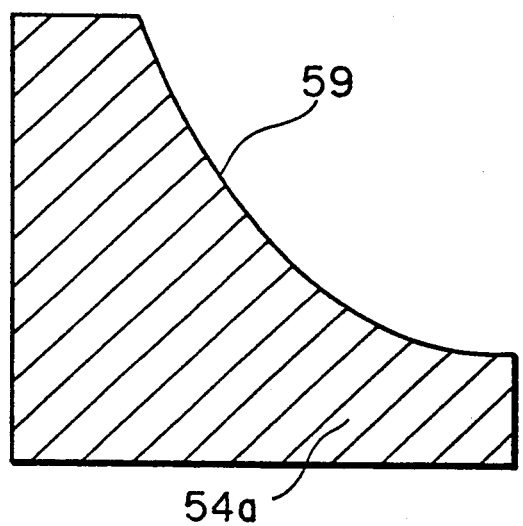

CHEMICAL VAPOR DEPOSITION METHOD, AND CHEMICAL VAPOR DEPOSITION TREATMENT SYSTEM AND CHEMICAL VAPOR DEPOSITION APPARATUS THEREFOR

BACKGROUND OF THE INVENTION

1. Field of the Invention

The present invention relates to a chemical vapor deposition (CVD) method of supplying a reaction gas to a substrate and forming a thin film having a prescribed composition on the substrate surface by chemical reaction in a vapor phase or that caused on the substrate surface, and a CVD treatment system and a CVD apparatus therefor.

2. Description of the Background Art

FIG. 17 is a front sectional view showing a principal part of a conventional normal-pressure CVD apparatus. A reaction housing 1 is formed by a reaction housing body 2 and a reaction housing head portion 3, so that its internal space (reaction space 4) is isolated from the outside air. A substrate support 5 supports a semiconductor substrate 6 in the reaction space 4. This substrate support 5 comprises a heater 7 and a soaking plate 8. The substrate support 5 so supports the semiconductor substrate 6 as to horizontally maintain both major surfaces thereof while downwardly directing one major surface (treated major surface) 9 to be provided with a thin film by chemical reaction. The soaking plate 8 vacuum-sucks a rear major surface 10 of the semiconductor substrate 6, to closely fix the semiconductor substrate 6. A reaction gas introduction plate 11 is provided to face the treated major surface 9, and reaction gas introduction holes 12 are provided in this reaction gas introduction plate 11 in a region substantially opposite to the treated major surface 9. The reaction housing head portion 3 is provided with an exhaust passage 13 which is opened toward the reaction housing 4, and a central axis 14 of this exhaust passage 13 is inclined toward the surface of the substrate 6 to be circumferentially separated from the edge of the semiconductor substrate 6 in relation to the reaction space 4. The reaction housing 1 is provided with a carrier passage 15 for introducing the semiconductor substrate 6 from the exterior into the reaction space 4 and discharging the former from the latter, while a gate 16 is provided for closing the carrier passage 15, thereby isolating the reaction space 4 from the outside air. The gate 16, which can be freely opened and closed, is opened when the semiconductor substrate 6 is introduced or discharged into or from the reaction space 4. A reaction gas mixing chamber 17 is provided in connection to the reaction gas introduction plate 11 in an opposite side of the reaction space 4, receiving the semiconductor substrate 6, in relation to the reaction gas introduction plate 11. The reaction gas mixing chamber 17 is provided with a plurality of reaction gas supply holes 18a and 18b.

The operation of this apparatus is now described. The gate 16 is opened to insert the semiconductor substrate 6 in the reaction space 4 through the carrier passage 15. The soaking plate 8 closely fixes the semiconductor substrate 6. A first reaction gas 21a which is prepared from silane gas ($SiH_4$) and a second reaction gas 21b which is prepared from oxygen gas ($O_2$), for example, are supplied into the reaction gas mixing chamber 17 from the reaction gas supply holes 18a and 18b respectively. The reaction gas mixing chamber 17 mixes such a plurality of types of reaction gases 21a and 21b with each other The as-mixed reaction gas 21 is injected into the reaction space 4 through the reaction gas introduction holes 12. Heat generated by the heater 7 is uniformly transferred to the overall semiconductor substrate 6 through the soaking plate 8. Due to such heat, the reaction gas 21 causes thermochemical reaction such as oxidation, for example, so that the reaction product of silicon dioxide ($SiO_2$) is deposited on the treated major surface 9 to form a thin film. An exhaust gas containing a reaction residue gas and the like is continuously discharged to the exterior of the reaction space 4 through the exhaust passage 13. When a thin film of a prescribed thickness is formed on the treated major surface 9, the gate 16 is opened and the semiconductor substrate 6 is separated from the soaking plate 8 to be discharged from the reaction space 4 to the exterior through the carrier passage 15. Since thin films are thus formed on a number of such semiconductor substrates 6, reaction byproducts 22 are gradually deposited on peripheries 23 of the reaction gas introduction holes 12 as the aforementioned operation is repeated.

The conventional CVD apparatus having the aforementioned structure requires a cleaning operation for removing the reaction byproducts 22 deposited on the peripheries 23 of the reaction gas introduction holes 12. Thus, the CVD apparatus must be periodically stopped for such cleaning operation, and hence the throughput of the apparatus is disadvantageously reduced. Further, the reaction byproducts 22 deposited on the peripheries 23 of the reaction gas introduction holes 21 are blown up when the semiconductor substrate 6 is introduced into or discharged from the reaction space 4, to stick onto the semiconductor substrate 6 as foreign matters. Thus, the yield of finished semiconductor devices, which are formed on the basis of such semiconductor substrates 6, is disadvantageously reduced.

SUMMARY OF THE INVENTION

The present invention is directed to a chemical vapor deposition method of supplying a reaction gas to a treated substrate and forming a film having a prescribed composition on a major surface of the substrate by chemical reaction of the reaction gas.

According to the present invention, the method comprises (a) a step of isolating a reaction space for making the chemical reaction from the outside air, (b) a step of establishing an exhaust passage communicating with the reaction space, (c) a step of supporting the substrate in the reaction space while heating the same, (d) a step of injecting the reaction gas toward the major surface of the substrate from a reaction gas introduction hole which is opened toward the major surface for growing the film on the major surface by the chemical reaction of the reaction gas, (e) a step of injecting an inert gas from an inert gas injection hole which is provided around the reaction gas introduction hole to be opened substantially toward the exhaust passage, and (f) a step of discharging an exhaust gas resulting from the reaction gas and the inert gas through the exhaust passage.

A chemical vapor deposition treatment system according to the present invention comprises (a) substrate support means for supporting a treated substrate while heating the same, (b) a reaction housing receiving the substrate and the substrate support means, defining a reaction space facing the major surface of the substrate and being provided with an exhaust passage communicating with the reaction space, (c) reaction gas introduction means facing the major surface of the substrate and having a reaction gas introduction hole being opened toward the surface of the substrate, (d) inert gas introduction means being provided around the reaction gas introduction means and having an inert gas injection hole being opened substantially toward the exhaust passage, (e) reaction gas supply means being coupled to the reaction gas introduction means for supplying a reaction gas into the reaction space from the reaction gas introduction hole, (f) inert gas supply means being coupled to the inert gas introduction means for injecting an inert gas into the exhaust passage through the inert gas injection hole, and (g) exhaust means being coupled to the exhaust passage for discharging an exhaust gas resulting from the reaction gas and the inert gas through the exhaust passage.

The inert gas supply means may comprise (f-1) inert gas generation means for generating a pressurized inert gas, and (f-2) mass flow control means being interposed between the inert gas generation means and the inert gas introduction means for controlling the flow rate of the pressurized inert gas and supplying the same to the inert gas introduction means.

According to the present invention, the inert gas injection hole is located around the reaction gas introduction hole for injecting the reaction gas toward the major surface of the treated substrate so that the inert gas is injected substantially toward the exhaust passage, whereby the flow of the inept gas promotes the flow of the exhaust gas containing a reaction byproduct. Thus, the exhaust gas containing the reaction byproduct is quickly discharged to the exhaust passage following the flow of the inert gas. Consequently, the reaction byproduct is hardly deposited on the periphery of the reaction gas introduction hole.

Therefore, it is possible to reduce the frequency of stoppage of the apparatus for a cleaning operation thereby improving the throughput, while it is also possible to reduce the possibility of sticking of foreign matters to the substrate, thereby improving the yield of finished products fabricated from such substrates.

The flow rate of the inert gas is controlled by the mass flow control means, whereby the flow rate of the inert gas is automatically maintained at an optimum value.

In an aspect of the present invention, a chemical vapor deposition method comprises (a) a step of isolating a reaction space for making chemical reaction from the outside air by a reaction housing, (b) a step of establishing an exhaust passage communicating with the reaction space, (c) a step of supporting the substrate in the reaction housing while heating the same, (d) a step of injecting the reaction gas toward the major surface of the substrate for growing the film on the major surface by the chemical reaction of the reaction gas, (e) a step of guiding a flow of an exhaust gas resulting from the reaction gas by rectification means provided around the reaction space for converting the flow of the exhaust gas from the reaction space to the exhaust passage to a laminar flow, and (f) discharging the exhaust gas being converted to the laminar flow through the exhaust passage.

The step (a) may comprise (a-1) a step of establishing a substrate carrier passage communicating with the reaction space for introducing the substrate from the exterior of the reaction housing into the reaction housing and discharging the former from the latter in a part of the reaction housing. The substrate carrier passage has a first opening which is opened in the interior of the reaction housing and a second opening which is opened in the exterior of the reaction housing, while the step (e) comprises (e-1) a step of forming the rectification means to be provided with a movable portion covering the first opening and a fixed portion fixed in a position avoiding the first opening. Further, the step (c) comprises (c-1) a step of opening the first opening by driving the movable portion, (c-2) a step of introducing the substrate from the exterior of the reaction housing into the reaction space through the substrate carrier passage, and (c-3) a step of closing the first opening by driving the movable portion.

The rectification means may further comprise sealing means which is provided around the movable portion, while the step (c-3) comprises (c-3-1) a step of bringing a clearance between the movable portion and the first opening into an airtight state by the sealing means when the first opening is closed by the movable portion.

A chemical vapor deposition treatment system according to another aspect of the present invention is a system which is employable for carrying out the method, this system comprises (a) substrate support means for supporting a treated substrate while heating the same, (b) a reaction housing receiving the substrate and the substrate support means, defining a reaction space facing the major surface and being provided with an exhaust passage communicating with the reaction space, (c) gas introduction means facing the major surface of the substrate and having a reaction gas introduction hole being opened toward the major surface of the substrate, (d) rectification means being provided in the reaction housing and having a wall surface for converting a flow of an exhaust gas resulting from the reaction gas from the reaction space to the exhaust passage to a laminar flow, (e) reaction gas supply means being coupled to the reaction gas introduction hole for supplying a reaction gas from the reaction gas introduction hole into the reaction space, and (f) exhaust means being coupled to the exhaust passage for discharging the exhaust gas through the exhaust passage.

Since the rectification means is so provided as to convert the flow of the exhaust gas containing the reaction byproduct to a laminar flow, whereby no drift is formed by disturbance of the flow during movement of the exhaust gas to the exhaust passage, and hence the reaction byproduct is hardly deposited on the periphery of the reaction gas introduction hole.

Therefore, it is possible to reduce the frequency of stoppage of the apparatus for a cleaning operation thereby improving the throughput, while it is also possible to reduce the possibility of sticking of foreign matters to the substrate, thereby improving the yield of finished products fabricated from such substrates.

Particularly when a portion of the rectification means facing the opening of the passage for the substrate which is introduced from the exterior into the reaction housing and discharged from the latter to the former is rendered movable, it is possible to prevent deposition of the reaction byproduct while maintaining a function of easily introducing and discharging the substrate without decomposing the reaction housing.

When the movable portion is provided with a seal for isolating the interior of the reaction housing from the outside air, further, the opening of the substrate passage is closed by the movable portion for isolating the interior of the reaction housing from the exterior during reaction while the same is opened as a gate for introducing and discharging the substrate, whereby there is no need to provide an independent gate.

Accordingly, an object of the present invention is to provide a CVD method which can improve the throughput by preventing deposition of reaction by-products on peripheries of reaction gas introduction holes thereby reducing the frequency of stoppage of the apparatus for a cleaning operation as well as suppressing the probability of sticking of foreign matters to the substrate thereby improving the yield of finished products fabricated from such substrates, and a CVD treatment system and a CVD apparatus therefor.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a plan view showing a fixed current plate and a movable current plate in the normal-pressure CVD treatment system according to the third embodiment;

FIG. 13 is a sectional view showing another example of the fixed current plate;

DESCRIPTION OF THE PREFERRED EMBODIMENTS

Figure 1:
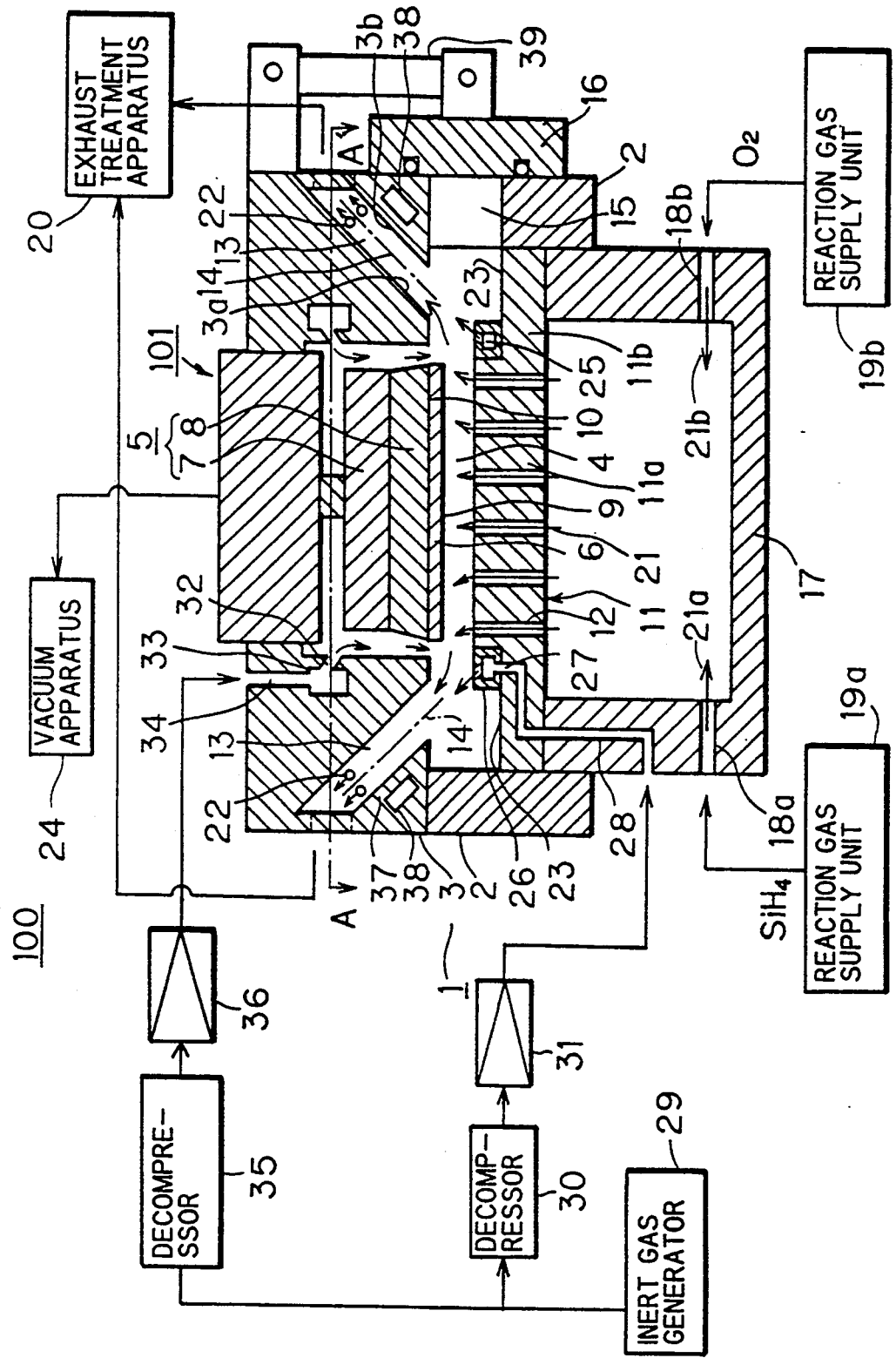
FIG. 1 is a front sectional view showing a normal-pressure CVD treatment system according to a first embodiment of the present invention.

FIG. 1 is a front sectional view showing a normal-pressure CVD treatment system 100 according to a first embodiment of the present invention. This system 100 comprises a normal-pressure CVD apparatus 101 corresponding to a system body, and equipments provided around the same.

Overall Structure of Normal-Pressure CVD Apparatus 101

The normal-pressure CVD apparatus 101 has a reaction housing 1, which is formed by a reaction housing body 2 and a reaction housing head portion 3. The reaction housing 1 isolates its internal space, i.e., a reaction space 4, from the outside air. Since a semiconductor substrate 6 is substantially circular, the reaction space 4 has a substantially circular outer periphery.

A substrate support 5 for supporting the semiconductor substrate 6 and heating the same is suspended from an upper portion of the reaction housing 1. The substrate support 5, which comprises a heater 7 and a soaking plate 8, downwardly and horizontally supports the semiconductor substrate 6 so that its treated major surface 9 faces the reaction space 4. The soaking plate 8 also has a function of vacuum-sucking a rear major surface 10 of the semiconductor substrate 6, thereby closely fixing the semiconductor substrate 6. Namely, this apparatus 101 is a face-down system normal-pressure CVD apparatus.

A gas introduction plate 11 is provided to face the treated major surface 9. This gas introduction plate 11 has a convex portion 11a which is located on a central region to face the semiconductor substrate 6 and a flange portion 11b enclosing the convex portion 11a, while the convex portion 11a and the flange portion 11b are integrated with each other. A plurality of reaction gas introduction holes 12 substantially facing the treated major surface 9 are provided to vertically pass through the convex portion 11a.

The reaction housing head portion 3 is provided with an exhaust passage 13 having an exhaust intake facing the reaction space 4 under a portion around the semiconductor substrate 6, and a central axis 14 of this exhaust passage 13 is inclined with respect to the surface of the substrate 6 to be separated from the edge of the semiconductor substrate 6 in relation to the reaction space 4. This exhaust passage 13 is a space, having a circle enclosing the periphery of the reaction space 4 as a lower edge, which is defined between two truncated-conical tapered wall surfaces 3a and 3b of the reaction housing head portion 3 to gradually upwardly spread from the bottom.

A heater 38 is embedded in the tapered wall surface 3a, to heat the wall surfaces 3a and 3b defining the exhaust passage 13.

The reaction housing 1 is provided with a carrier passage 15 for introducing the semiconductor substrate 6 from the exterior into the reaction space 4 and discharging the same from the latter to the former, while a gate 16 is provided to close the exhaust passage 15 for isolating the same from the outside air. The gate 16, which can be freely opened and closed, is opened when the semiconductor substrate 6 is introduced or discharged into or from the reaction space 4.

A reaction gas mixing chamber 17 is provided in connection to the gas introduction plate 11 on an opposite side of the reaction space 4 receiving the semiconductor substrate 6 with respect to the gas introduction plate 11. The reaction gas mixing chamber 17 is provided with a plurality of reaction gas supply holes 18a and 18b.

Inert Gas Supply Passage in Normal-Pressure CVD Apparatus

A first inert gas passage 28 is formed in a wall surface of the reaction gas mixing chamber 17, so that its opening 27 is located on the upper surface of the flange portion 11b of the gas introduction plate 11.

A hollow cylindrical inert gas injection member 26 is provided on the flange portion 11b to enclose the convex portion 11a of the gas introduction plate 11. A hollow portion of the inert gas injection member 26 communicates with the opening 27 of the first inert gas passage 28. The upper surface of the inert gas injection member 26 is located in a boundary between the reaction space 4 and the exhaust passage 13, and this upper surface is provided with a plurality of inert gas injection holes 25 which are opened substantially toward the exhaust passage 13.

A second inert gas passage 33 is formed in the reaction housing head portion 3. This second inert gas passage 33, which is a ring-shaped passage enclosing the periphery of the upper portion of the substrate support 5, communicates with an opening 34 formed in the upper surface of the reaction housing head portion 3. The second inert gas passage 33 communicates with a second inert gas injection hole 32, which is obliquely downwardly opened toward a space defined around the substrate support 5.

Structure of Equipments

The reaction gas supply holes 18a and 18b are connected with reaction gas supply units 19a and 19b through pipes respectively. The reaction gas supply units 19a and 19b supply silane gas 21a and oxygen gas 21b to the reaction gas supply holes 18a and 18b respectively, so that these reaction gases 21a and 21b are mixed with each other in the reaction gas mixing chamber 17 to form a mixed reaction gas 21.

The exhaust passage 13 is connected with an exhaust treatment unit 20 through a pipe. The soaking plate 8 vacuum-sucks the rear major surface 10 of the semiconductor substrate 6 through action of a vacuum apparatus 24 which is connected to the substrate support 5 through a pipe.

An inert gas generator 29 for generating a pressurized inert gas is provided for supplying first and second inert gases to the normal-pressure CVD apparatus 101. This inert gas generator 29 may be formed by an inert gas storing equipment or an inert gas cylinder, which is installed in a factory. According to this embodiment, the first and second inert gases are prepared from nitrogen ($N_2$) gas. Therefore, the inert gas generator 29 is employed for generating the first and second inert gases in common, while separate inert gas generators may alternatively be provided for independently generating first and second inert gases.

A pipe from the inert gas generator 29 is divided into two branches, which are connected to first and second decompressors 30 and 35 respectively. Alternatively, the pipe from the inert gas generator 29 may be divided into two branches after the same passes through a single decompressor.

The inert gases decompressed by the first and second decompressors 30 and 35 respectively are supplied to first and second mass flow controllers 31 and 36. The mass flow controllers 31 and 36 have flow rate control mechanisms, to be capable of arbitrarily setting mass flow rates of the first and second inert gases passing therethrough. While the mass flow controllers 31 and 36 may be replaced by combinations of flow control valves and flow meters, employment of such mass flow controllers is preferable since the flow rates of the inert gases can be regularly maintained in the set values even if pressures of the inert gases supplied from the decompressors 30 and 35 are changed.

The first and second inert gases, whose mass flow rates are controlled by the mass flow controllers 31 and 36, are supplied to the first and second inert gas passages 28 and 34 respectively. Thus, it is possible to inject the first and second inert gases from the inert gas injection holes 25 and 32 into the reaction housing 1 at the previously set flow rates respectively.

Detailed Structure of Normal-Pressure CVD Apparatus 101

Figure 2:
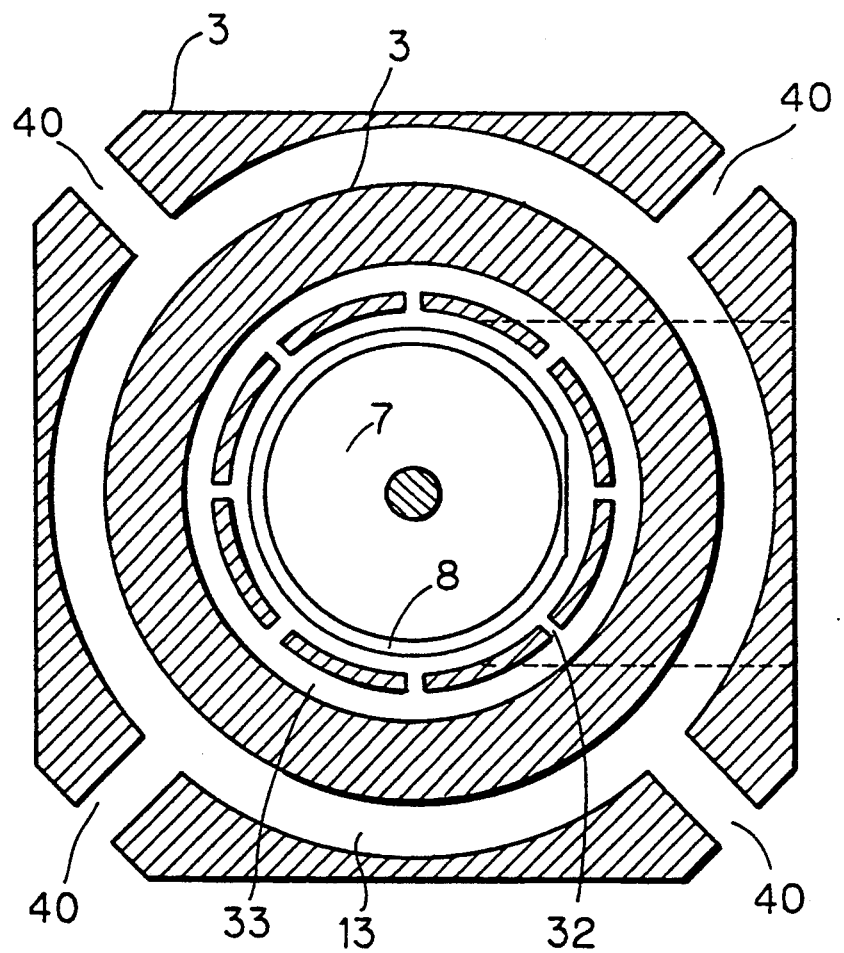
FIG. 2 is a fragmentary plan view taken along the line A—A' in FIG. 1.

FIG. 2 is a fragmented plan view of the CVD apparatus 101 taken along the line A—A' shown in FIG. 1. The exhaust passage 13 is in the form of a circular groove which is arranged to enclose the semiconductor substrate 6, and communicates with the exhaust treatment unit 20 shown in FIG. 1 through pipelines 40 which are formed in ends of the exhaust passage 13 located at four corners of the reaction housing head portion 3.

Figure 3:
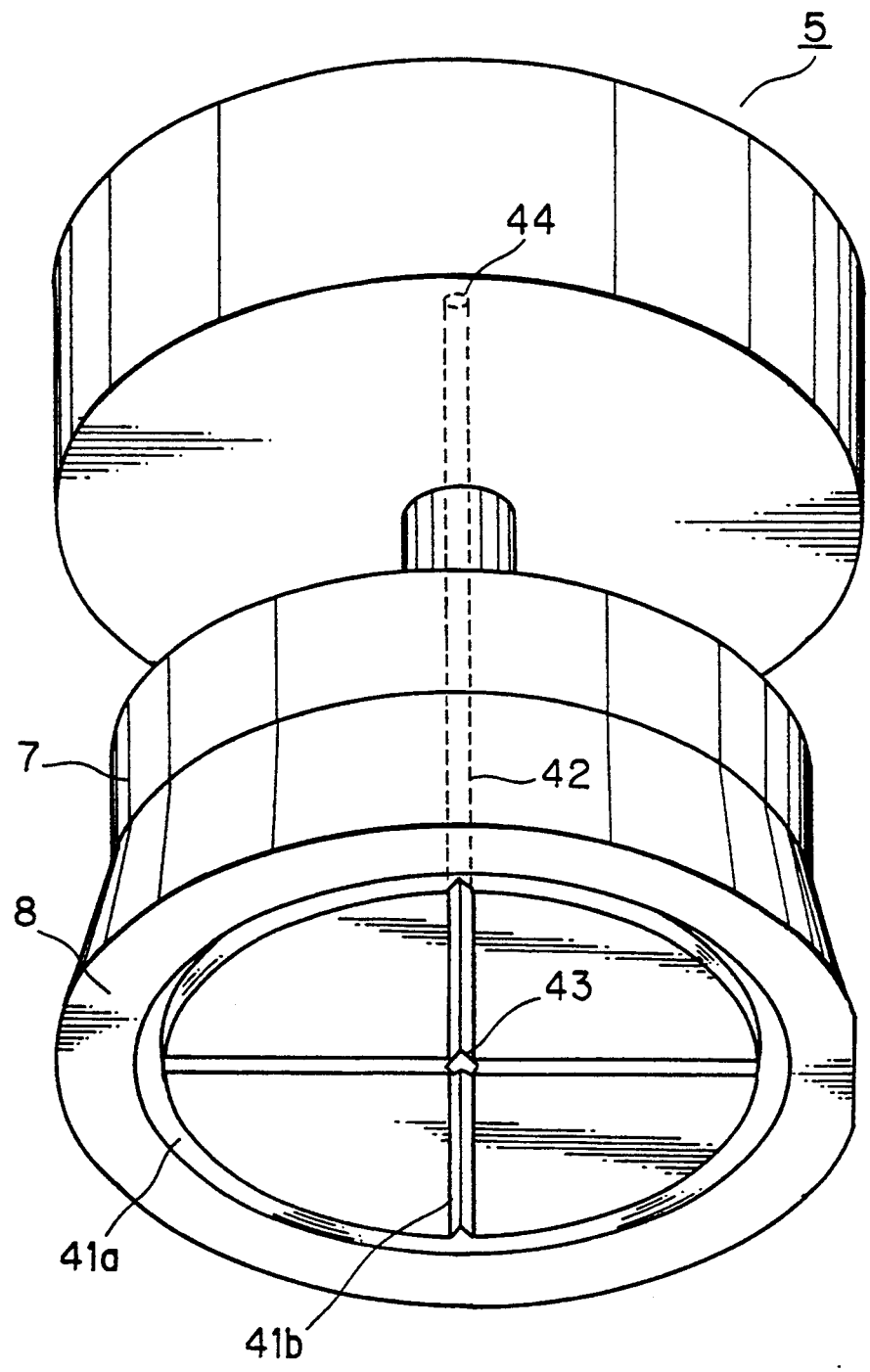
FIG. 3 is a perspective view showing a substrate support member.

FIG. 3 is a perspective view showing the substrate support 5. A circular groove 41a and a cross groove 41b are formed in the bottom surface of the soaking plate 8, while an end 43 of a hole 42 passing through the central axis of the substrate support 5 is opened at the center of the cross groove 41b. Another end 44 of the hole 42 is connected to the vacuum apparatus 24 shown in FIG. 1 through a pipe.

Figure 4:
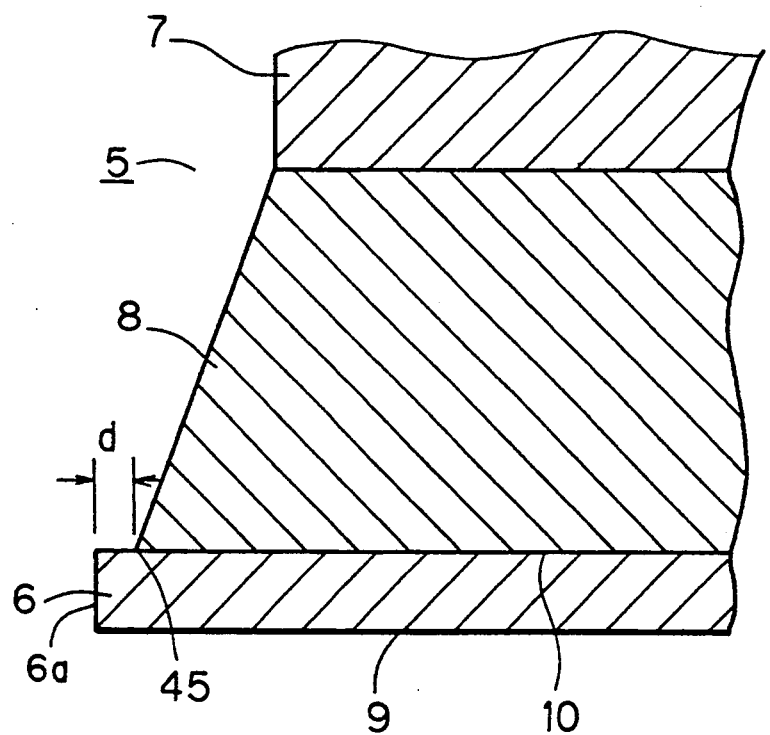
FIG. 4 is a sectional view showing a substrate mounted on the substrate support member.

FIG. 4 is a partial sectional view showing the substrate support 5 sucking a semiconductor substrate 6. The diameter of the soaking plate 8 is slightly smaller than that of the semiconductor substrate 6, which is so sucked by the soaking plate 8 such that an edge 6a of the semiconductor substrate 6 slightly circumferentially projects from an edge 45 of the soaking plate 8 on a surface which is in contact with the semiconductor substrate 6. A distance d of such projection is about 0.5 mm, for example.

Figure 5:
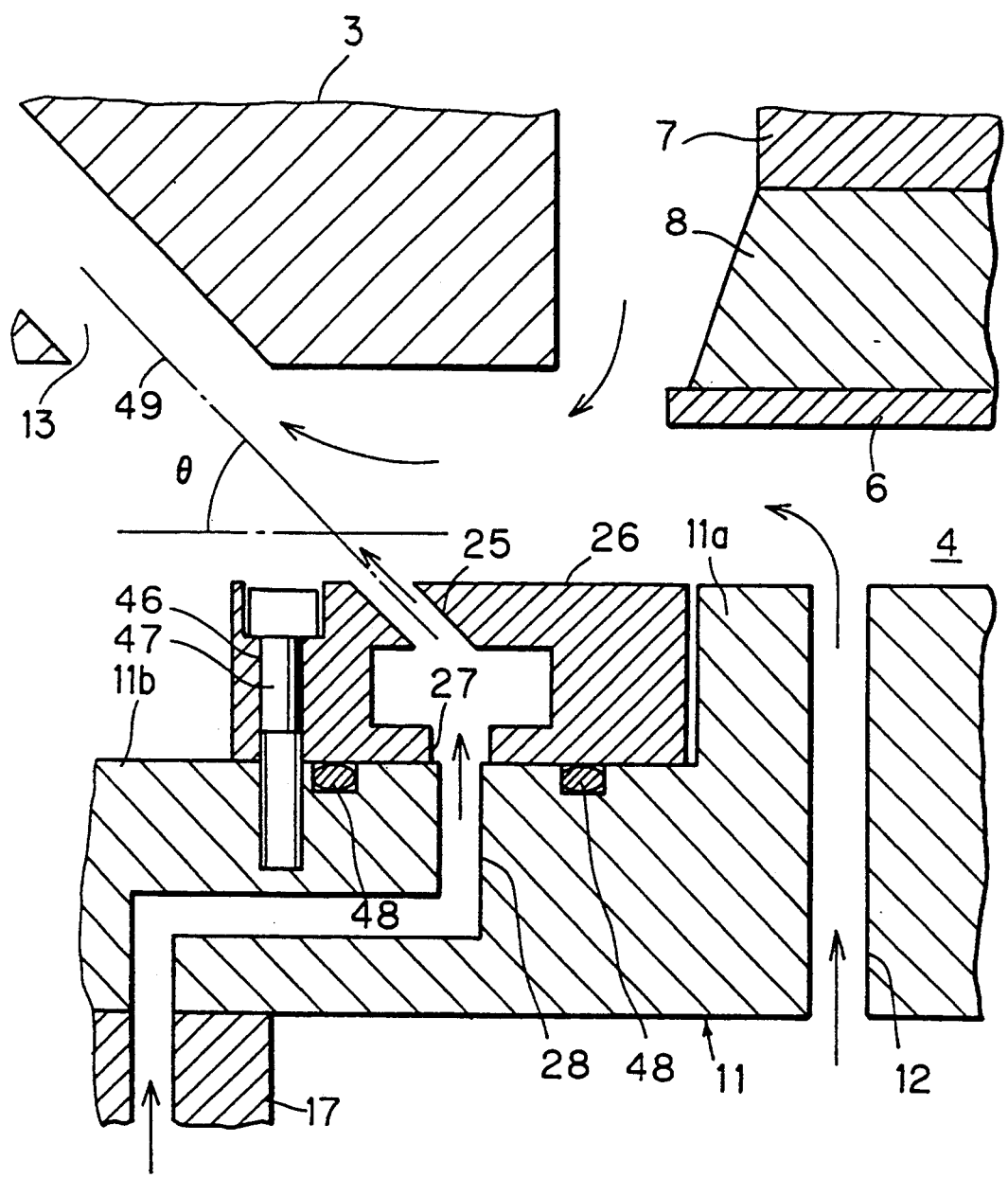
FIG. 5 is a sectional view showing an inert gas injection member and the periphery thereof in detail.

FIG. 5 is a detailed sectional view showing the inert gas injection member 26 and a portion around the same. The inert gas injection member 26 is provided with a bolt hole 46, to be fixed to the reaction gas introduction plate 11 by a bolt 47 passing through the bolt hole 46. An O-ring 48 is mounted on a portion around an end of the first inert gas passage 28 provided on the surface of the gas introduction plate 11, to enclose the first inert gas passage 28. Thus, an inept gas passing through the first inert gas passage 28 is introduced into the inert gas introduction hole 27 with no leakage through a clearance between the reaction gas introduction plate 11 and the inert gas injection member 26. Each inert gas injection hole 25 is so provided that its central axis 49 has a prescribed elevation angle $\theta$ from the diametrical direction of the annular inert gas injection member 26, thereby being directed substantially toward the opening of the exhaust passage 13. Preferably the elevation angle θ set in the aforementioned manner is about 45°.

Figure 6:
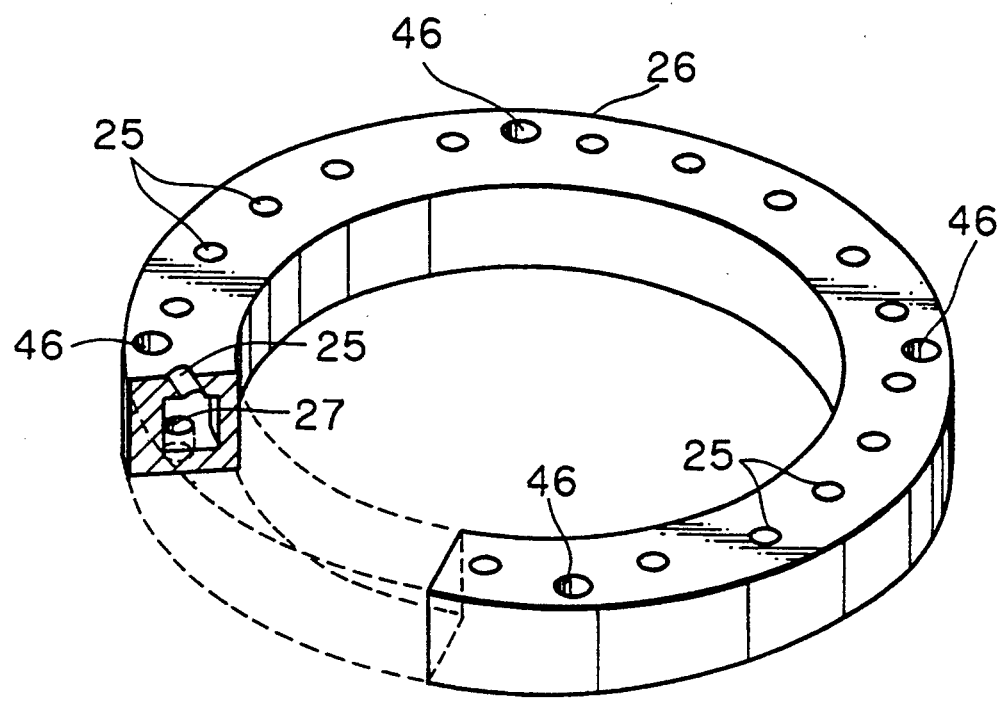
FIG. 6 is a partially fragmented perspective view showing the inert gas injection member.

FIG. 6 is a partially fragmented perspective view showing the inert gas injection member 26 in a partially fragmented manner. A number of inert gas injection holes 25 are provided on the upper surface of the hollow and annular inert gas injection member 26 substantially at regular intervals along the circumferential direction of the inert gas injection member 26, while the inert gas introduction hole 27 is provided in one portion of the bottom surface. The number of the inert gas injection holes 25 is preferably at least 20.

Operation of System

An operation for forming a thin film on the lower surface of the semiconductor substrate with this normal-pressure CVD treatment system is as follows: First, the gate 16 is opened through a switching mechanism 39, and the semiconductor substrate 6 is inserted in the reaction space 4 through the carrier passage 15. This operation is carried out with a substrate carrier such as a robot.

An arm of the substrate carrier is driven to locate the semiconductor substrate 6 so that the rear major surface 10 thereof is in contact with or close to the lower surface of the soaking plate 8, and thereafter the vacuum apparatus 24 shown in FIG. 1 is activated. Thus, a negative pressure is generated around the grooves 41 and 41b, to closely hold the semiconductor substrate 6 on the lower surface of the soaking plate 8. Thereafter the arm of the substrate carrier is retracted to the exterior of the normal-pressure CVD apparatus 101, and the gate 16 is closed by the switching mechanism 39.

Then, the reaction gas 21 is supplied from the reaction gas mixing chamber 17 and injected into the reaction space 4 through the reaction gas introduction holes 12 toward the treated major surface 9 of the semiconductor substrate 6. Due to heating action of the heater 7, the reaction gas 21 causes thermochemical reaction such as oxidation, whereby the reaction product of silicon dioxide is deposited on the semiconductor substrate surface 9, to form a thin film. An exhaust gas containing an unreacted part of the reaction gas 21, a gas generated by reaction and the like is continuously discharged from the reaction space 4 through the exhaust passage 13, and fed to the exhaust treatment unit 20 through the pipe.

A part of the first inert gas transported from the inert gas generator 29 through the pipe in parallel with the aforementioned operations is so decompressed in the first decompressor 30 that its pressure is about 2 or 3 atm., and then transported to the first mass flow controller 31 to be so automatically controlled that its flow rate reaches a prescribed optimum value. The first inert gas, whose flow rate is thus controlled, is fed to the inert gas injection member 26 through the first inert gas passage 28 and the inert gas introduction hole 27.

The first inert gas reaching the inert gas injection member 26 is injected toward the exhaust passage 13 through the number of inert gas injection holes 25. Thus, the exhaust gas from the reaction space 4 is accelerated by the flow of the first inert gas and guided to the exhaust passage 31. Consequently, the reaction byproduct 22 contained in the exhaust gas is also quickly discharged to the exhaust passage 13 along the flow of the reaction gas 21. Thus, the reaction byproduct 22 is prevented from deposition on the peripheries 23 of the reaction gas introduction holes 12.

On the other hand, the second inert gas supplied to the second inert gas passage 33 is obliquely downwardly injected from the second inert gas injection hole 32 from above a side portion of the rear major surface 10 of the semiconductor substrate 6. Thus, a space above the edge of the semiconductor substrate 6 is filled with the second inert gas, to prevent the space from introduction of the reaction gas 21 and the reaction byproduct 22 contained in the reaction gas 21.

The flow rates set in the first and second mass flow controllers 31 and 36 are previously determined at optimum values, which are different from each other in general, in order to prevent deposition of the reaction byproduct 22.

A heater 38 is adapted to heat the wall surface of the exhaust passage 13, thereby removing the reaction byproduct 22 sticking onto this wall surface.

As hereinabove described with reference to FIG. 4, the edge of the semiconductor substrate 6 slightly circumferentially projects beyond the edge 45 of the soaking plate 8 on the surface which is in contact with the semiconductor substrate 6, whereby the surface is entirely reliably covered with the semiconductor substrate 6. In the surface of the soaking plate 8 which is in contact with the semiconductor substrate 6, therefore, no portion is directly exposed to the reaction gas 21 containing the reaction byproduct 22. Thus, it is guaranteed that a next new semiconductor substrate 6 can be reliably closely held on the bottom surface of the soaking plate 8.

Due to the aforementioned structure, all portions of the wall surface defining the reaction space 4 are prevented from sticking or deposition of the reaction byproduct 22. When a thin film of a prescribed thickness is formed on the semiconductor substrate surface 9, the switching mechanism 39 is driven to open the gate 16, so that the semiconductor substrate 6 is separated from the soaking plate 8 and discharged from the reaction space 4 to the exterior through the carrier passage 15. Also, this operation is generally carried out by a substrate carrier such as a robot.

Such operations are repeated on a plurality of semiconductor substrates, to successively form CVD films on the respective semiconductor substrates.

According to the system 100 of this embodiment, the peripheries 23 of the reaction gas introduction holes 12 are prevented from deposition of the reaction byproduct 22, whereby it is possible to reduce the frequency of decomposition and cleaning of the CVD apparatus 101.

Particularly in the system 100 according to this embodiment, the second inert gas is supplied to the second inert gas passage 33 while the wall surface of the exhaust passage 13 is heated by the heater 38, whereby the CVD apparatus 101 is also employable as a cleaningless apparatus.

Other Examples of Inert Gas Injection Members

Figure 7:
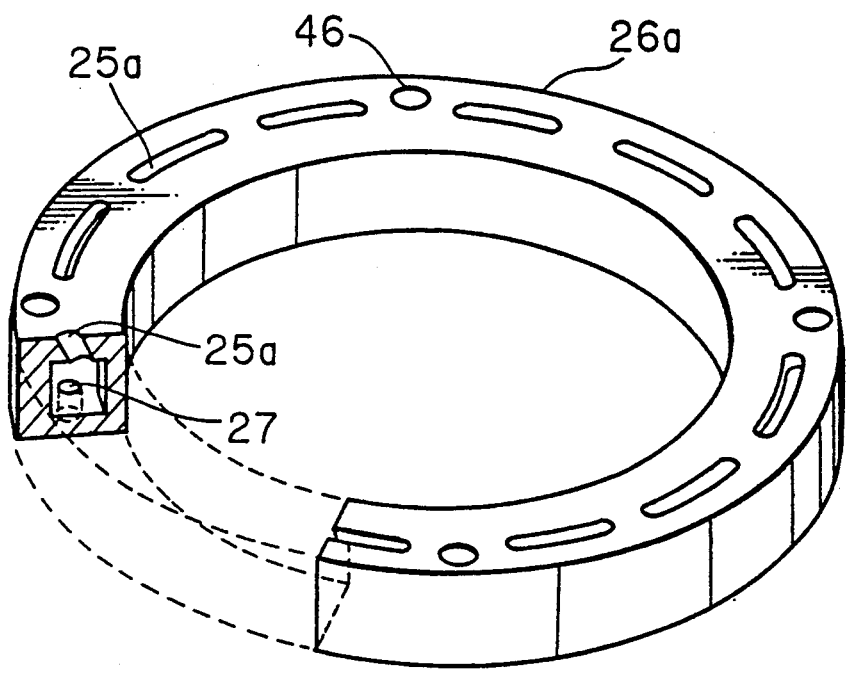
FIG. 7 is a partially fragmented perspective view showing another example of the inert gas injection member.

FIG. 7 is a partially fragmented perspective view showing an inert gas injection member 26a, which is employable in place of the inert gas injection member 26 shown in FIG. 1, in a partially fragmented manner. In this inert gas injection member 26a, slit-type inert gas injection holes 25a are arranged on the upper surface of a hollow ring substantially at regular intervals. Thus, the flow of the first inert gas around the reaction space 4 is further uniformly distributed as compared with the case of FIG. 1.

Figure 8:
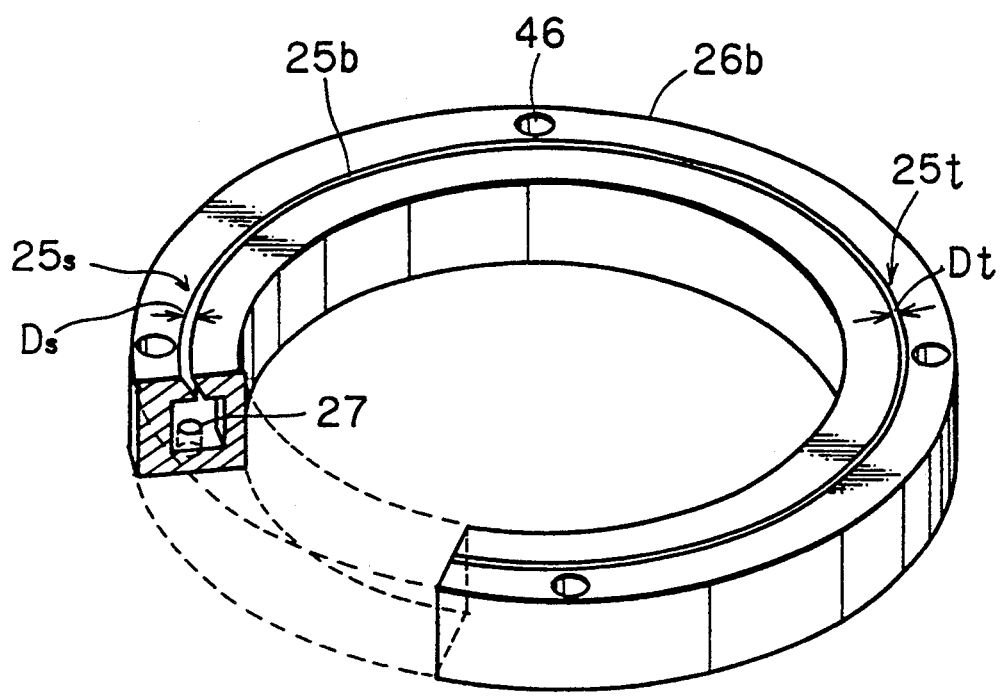
FIG. 8 is a partially fragmented perspective view showing still another example of the inert gas injection member.

FIG. 8 is a partially fragmented perspective view showing still another inert gas injection member 26b in a partially fragmented manner. This inert gas injection member 26b is provided with an inert gas injection hole 25b, which is in the form of a slit circumferentially provided along the upper surface of a hollow ring. In this case, it is possible to further uniformalize the distribution of the flow of the first inert gas around the reaction space 4. If a relatively large amount of the inert gas is injected in a portion 25s of the inert gas injection hole 25b close to the inert gas injection hole 27, however, the pressure of the inert gas injected from a portion 25t separated from the inert gas introduction hole 27 is so reduced that pressure distribution of the inert gas injected from the inert gas injection hole 25b is not necessarily uniformalized. In this case, therefore, the slit width is preferably gradually spread to provide the portion 25s close to the inert gas introduction hole 27 with a relatively small slit width Ds while providing the portion 25t separated from the inert gas introduction hole 27 with a relatively large slit width Dt.

Figure 9:
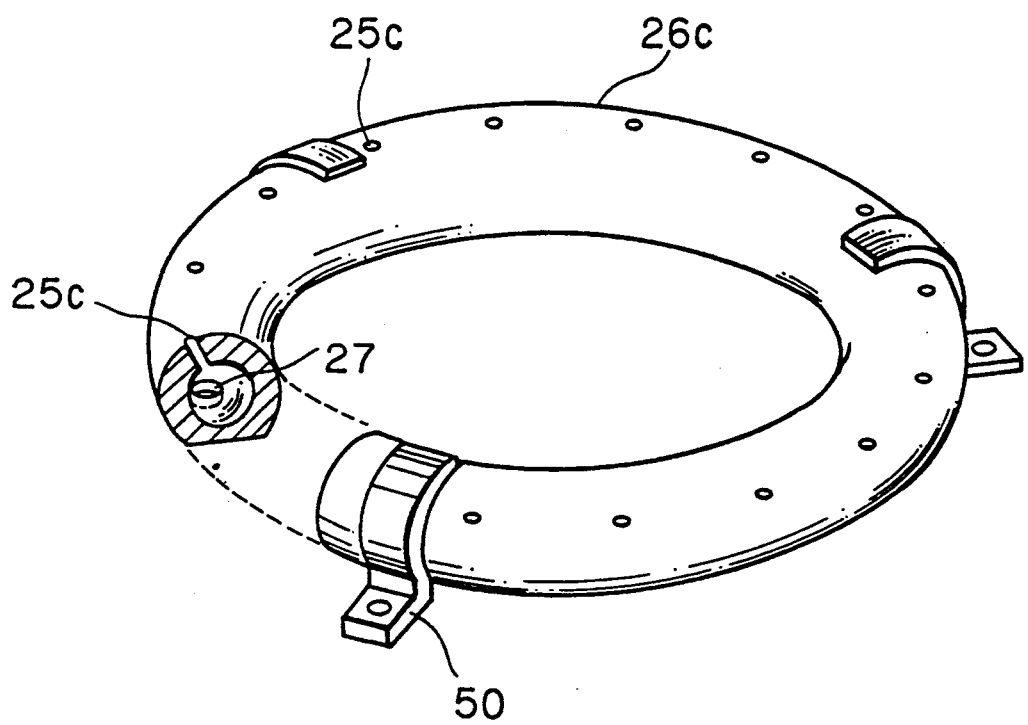
FIG. 9 is a partially fragmented perspective view showing a further example of the inert gas injection member.

FIG. 9 is a partially fragmented perspective view showing a further inert gas injection member 26c in a partially fragmented manner. In this inert gas injection member 26c, a hollow pipe is annularly bent to form a circle, whose bottom portion is worked into a flat surface in order to prevent leakage of inert gases. This inert gas injection member 26c is fixed to the gas introduction plate 11 by bolts 47 through clamps 50. While inert gas injection holes 25c illustrated in FIG. 9 are in circular configurations, the same may be in the form of slits. Such an inert gas injection member 26c can be further easily manufactured.

Second Embodiment

Figure 10:
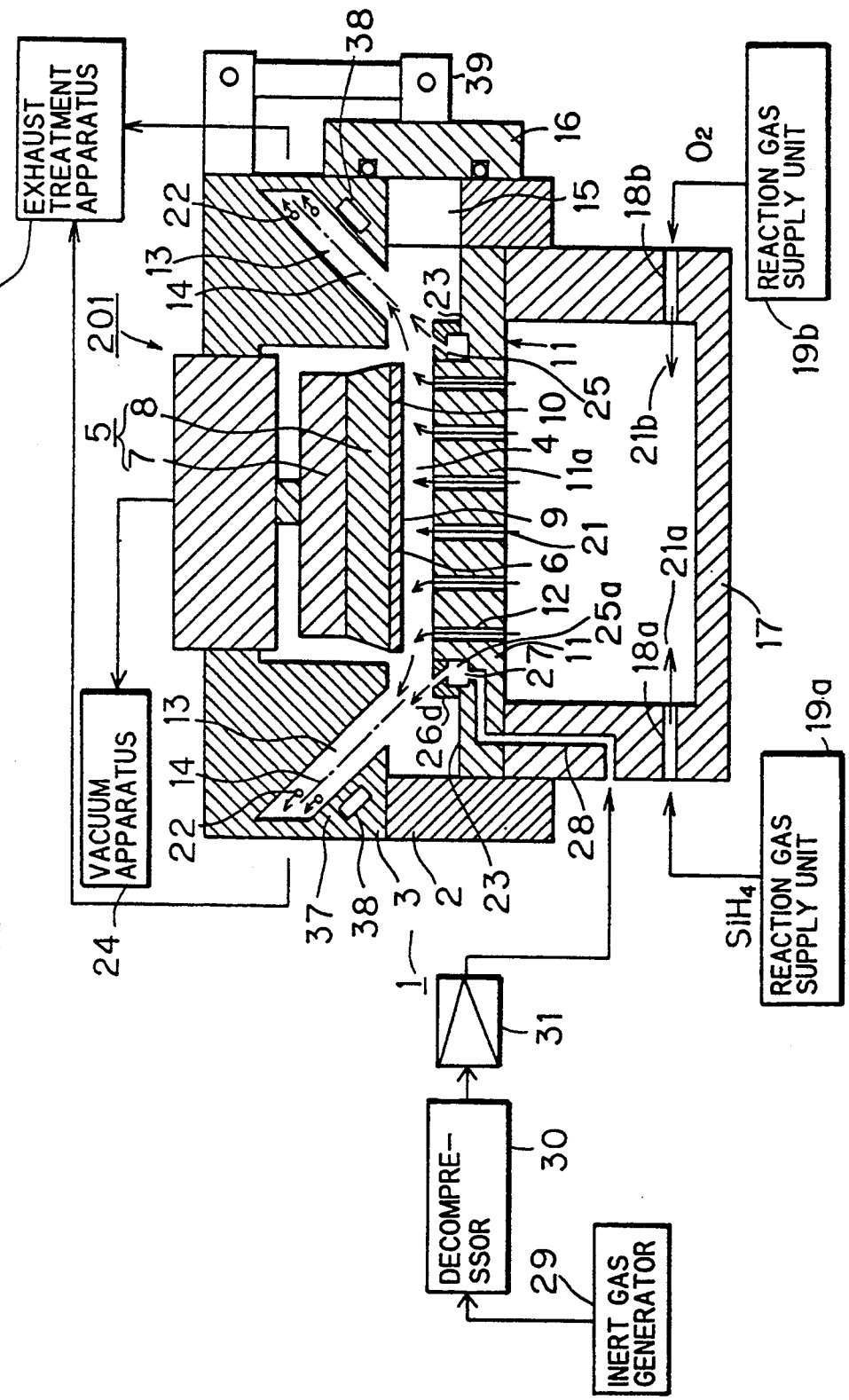
FIG. 10 is a front sectional view showing a normal-pressure CVD treatment system according to a second embodiment of the present invention.

FIG. 10 is a front sectional view showing a normal-pressure CVD treatment system 200 according to a second embodiment of the present invention. In this system 200, a structure for injecting a first inert gas in a normal-pressure CVD apparatus 201 is different from that in the first embodiment.

In this normal-pressure CVD apparatus 201, a ring-shaped hollow portion 25a is formed around the outer periphery of a central convex portion 11a of a gas introduction plate 11. The ring-shaped hollow portion 25a is formed by externally engaging a ring member 26d having a plurality of inert gas injection holes 25 with the central convex portion 11a and fixing the same. Similarly to the first embodiment, the inert gas injection holes 25 are located around a boundary between a reaction space 4 and an exhaust passage 13, to be opened toward the exhaust passage 13.

In the second embodiment, therefore, the inert gas injection holes 25 are substantially fixedly provided in the gas injection plate 11.

The remaining structure and the operation method of this embodiment is similar to those of the system 100 shown in FIG. 1

Also in the CVD apparatus 201, inert gases are injected from the inert gas injection holes, 25, to prevent a reaction byproduct 22 from deposition on peripheries 23 of reaction gas introduction holes.

When the inert gas injection holes 25 are made in the form of slits etc., it is possible to engrave the ring-shaped hollow portion 25a through such slits. Therefore, the convex portion 11a of the gas introduction plate 11 may have a relatively large diameter, so that the inert gas injection holes 25 and the ring-shaped hollow portion 25a are formed around the same. In this case, the ring member 26d may be omitted.

Third Embodiment

Structure

Figure 11:
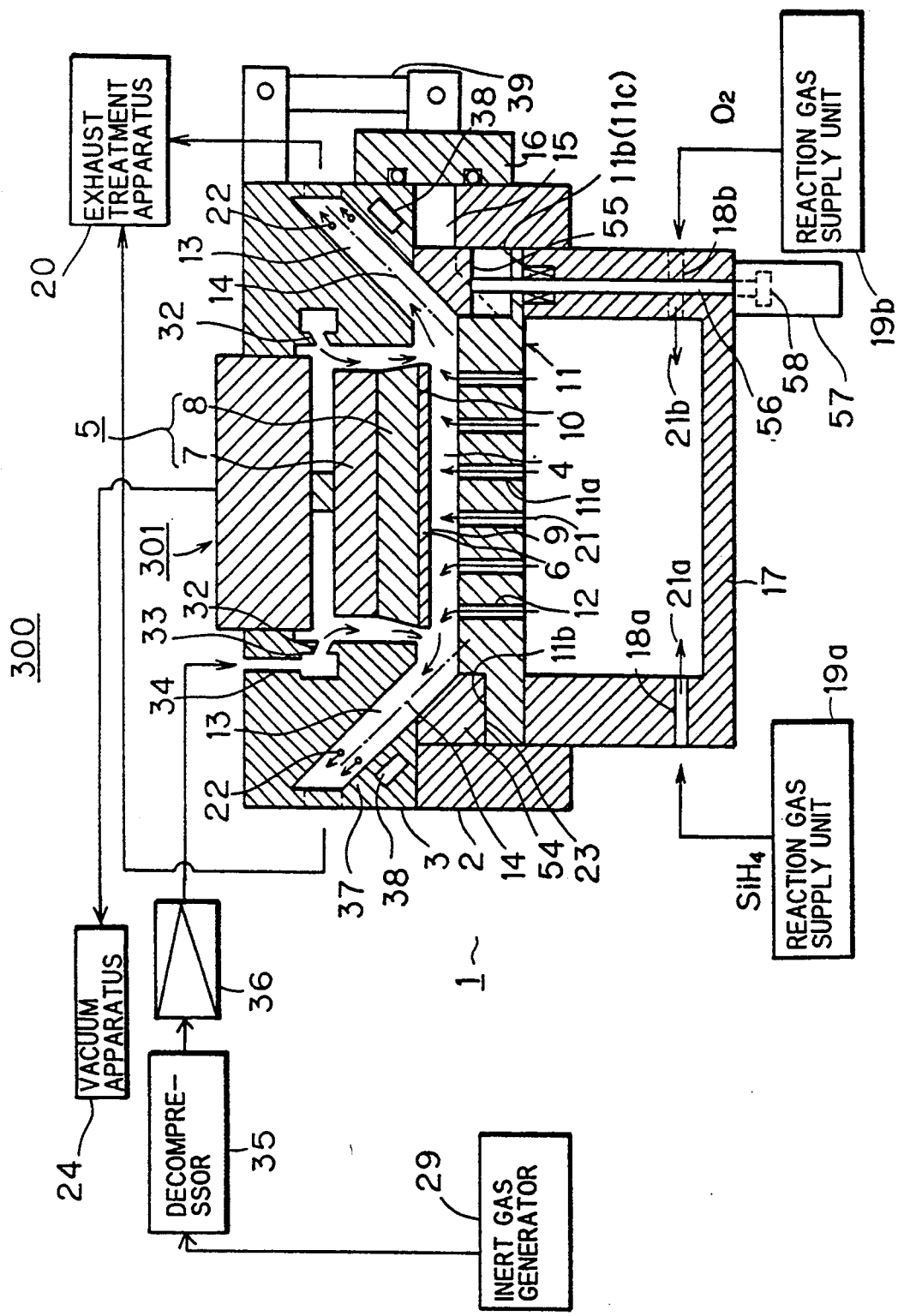
FIG. 11 is a front sectional view showing a normal-pressure CVD treatment system according to a third embodiment of the present invention.

FIG. 11 is a front sectional view showing a normal-pressure CVD treatment system 300 according to a third embodiment of the present invention. In a normal-pressure CVD apparatus 301 employed in this system 300, a fixed current plate 54 and a movable current plate 55 are set on a flange portion 11b corresponding to a periphery 23 of a gas introduction plate 11. The movable current plate 55 is connected to a piston 58 which slides in a direct-acting cylinder 57 through a rod 56 passing through a reaction gas mixing chamber 17.

FIG. 12 is a plan view showing a rectification member 51 which is formed by a combination of the fixed current plate 54 and the movable current plate 55. The rectification member 51 is in the form of a ring as a whole, and encloses an arrangement of reaction gas introduction holes 12 shown in FIG. 11. A part 11c, facing a substrate carrier passage 15, of the flange portion 11b shown in FIG. 11 is lower in vertical position than the remaining part, so that the movable current plate 55 is located on this part 11c. The fixed current plate 54 and the movable current plate 55 are in the form of circular arcs respectively, and the former is loner than the latter. The rectification member 51 has a trapezoidal section as shown in FIG. 11, and inclination of its hypotenuse is substantially identical to that of the bottom surface of an exhaust passage 13, so that the former is smoothly continuous to the latter.

The movable current plate 55 is vertically slidable due to action of the direct-acting cylinder 57, so that the movable current plate 55 is upwardly located during operation of the apparatus 301 as shown by solid lines in FIG. 11, while the same is downwardly located as shown by dotted lines in FIG. 11 when a semiconductor substrate 6 is introduced into or discharged from the apparatus 301. Due to such operation of the movable current plate 55, the semiconductor substrate 6 can be easily introduced and discharged through a carrier passage 15 without removing a reaction housing head portion 3. The direct-acting cylinder 57 can be replaced by another actuator.

Dissimilarly to the apparatus 101 according to the first embodiment, the apparatus 301 according to the third embodiment is provided with no inert gas injection holes and no passages for supplying inert gases thereto on the gas introduction plate 11. The remaining structure is similar to that of the system 100 according to the first embodiment.

Operation

When a gate 16 is opened in order to introduce the semiconductor substrate 6 into the apparatus 301, the movable current plate 55 is located on the position shown by dotted lines. In the process of instructing the semiconductor substrate 6 into a reaction space 4 so that the same is supported by a substrate support 5, therefore, the movable current plate 55 will not block the course of the semiconductor substrate 6.

After the semiconductor substrate 6 is supported by the substrate support 5, the direct-acting cylinder 57 is so driven as to upwardly move the movable current plate 55 to the position shown by solid lines. The gate 16 is closed around this operation.

Principles of supply of a reaction gas and formation of a CVD film are similar to those of the system 100 according to the first embodiment. When an exhaust gas flows to the exhaust passage 13, the fixed current plate 54 and the movable current plate 55 serve as guides for smoothly guiding the exhaust gas to that its flow is converted to a laminar flow. Therefore, the flow of the exhaust gas will not be disturbed to form an eddy current nor a drift remaining in a part. Thus, a reaction byproduct 22 contained in the exhaust gas is prevented from deposition on a wall surface around the reaction gas introduction hole 21.

After a CVD film is formed, the gate 16 is opened and the movable current plate 55 is downwardly moved to the position shown by dotted lines. Then, the semiconductor substrate 6 is discharged through the gate 16.

According to this apparatus 301, the fixed current plate 54 is separated from the gas introduction plate 11, so that the former can be removed from the latter after the reaction housing head portion 3 is upwardly separated from a reaction housing body 2. The movable current plate 55 can also be removed in a similar manner. Thus, the fixed and movable current plates 54 and 55 can be easily cleaned or exchanged.

Another Example of Current Plate

FIG. 13 is a sectional view showing a fixed current plate 54a which can be employed in place of the fixed current plate 54 shown in FIG. 11. The movable current plate 55 can also be replaced by a member having a section similar to that of the fixed current plate 54a.

While the fixed current plate 54 shown in FIG. 11 is provided with a slant face having a linear section for guiding the flow of the gas, this current plate 54a is provided with a wall surface 59 having a downwardly protruding curved section. Preferably the wall surface 59 has a contour in the form of a curved line for smoothly bending the streamline of a reaction gas 21, such as a spherical surface or a paraboloid, for example.

Fourth Embodiment

Figure 14:
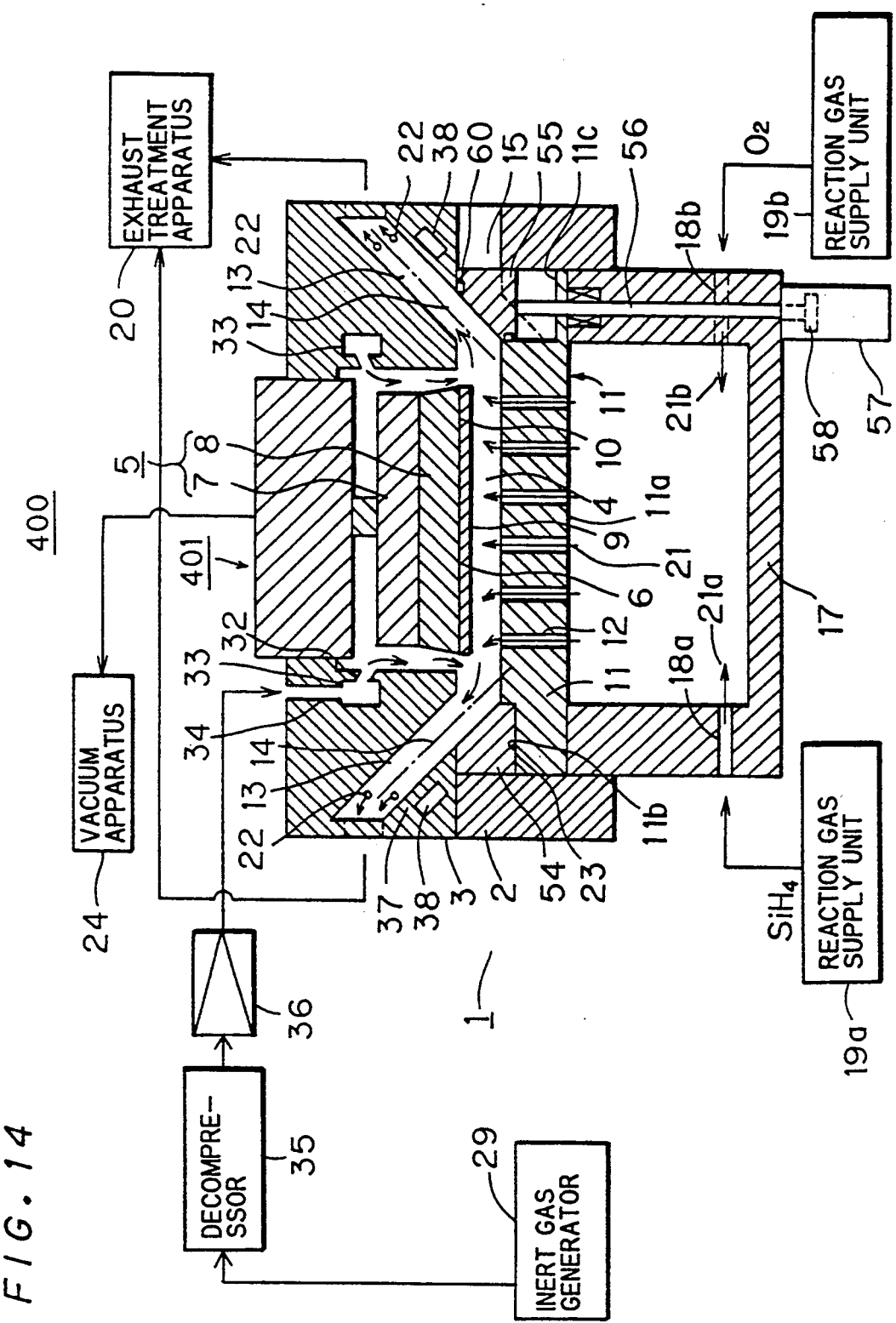
FIG. 14 is a front sectional view showing a normal-pressure CVD treatment system according to a fourth embodiment of the present invention.

FIG. 14 is a front sectional view showing a normal-pressure CVD treatment system 400 according to a fourth embodiment of the present invention. A normal-pressure CVD apparatus 401 employed in this system 400 is provided with an O-ring 60 enclosing the edge of a movable current plate 55. The gate 16 and the switching mechanism 39 shown in FIG. 11 can be omitted from the apparatus 401 according to the fourth embodiment.

Figure 15:
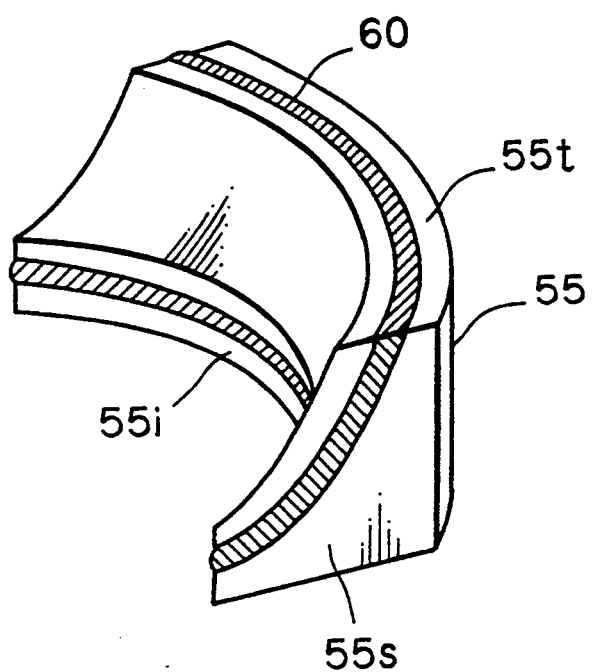
FIG. 15 is a perspective view showing an O-ring mounted on a movable current plate.

FIG. 15 is a detailed perspective view showing the movable current plate 55. The O-ring 60 is extended along an upper surface 55t, a side surface 55s and an inner side lower portion 55i of the movable current plate 55. These surfaces 55t, 55s and 55i correspond to surfaces which are brought into contact with peripheral members when the movable current plate 55 is upwardly located as shown by solid lines in FIG. 14.

Due to such a structure of the movable current plate 55, a reaction space 4 is airtightly held in relation to the outside air when the movable current plate 55 is upwardly located as shown by solid lines in FIG. 14. Namely, the movable current plate 55 also serves as a gate, whereby no separate gate 16 is required and the switching mechanism 39 for switching such a gate 16 can also be omitted. Thus, the structure of this apparatus 401 is simplified, while a semiconductor substrate 6 can be further easily introduced into and discharged from the reaction space 4.

Fifth Embodiment

Figure 16:
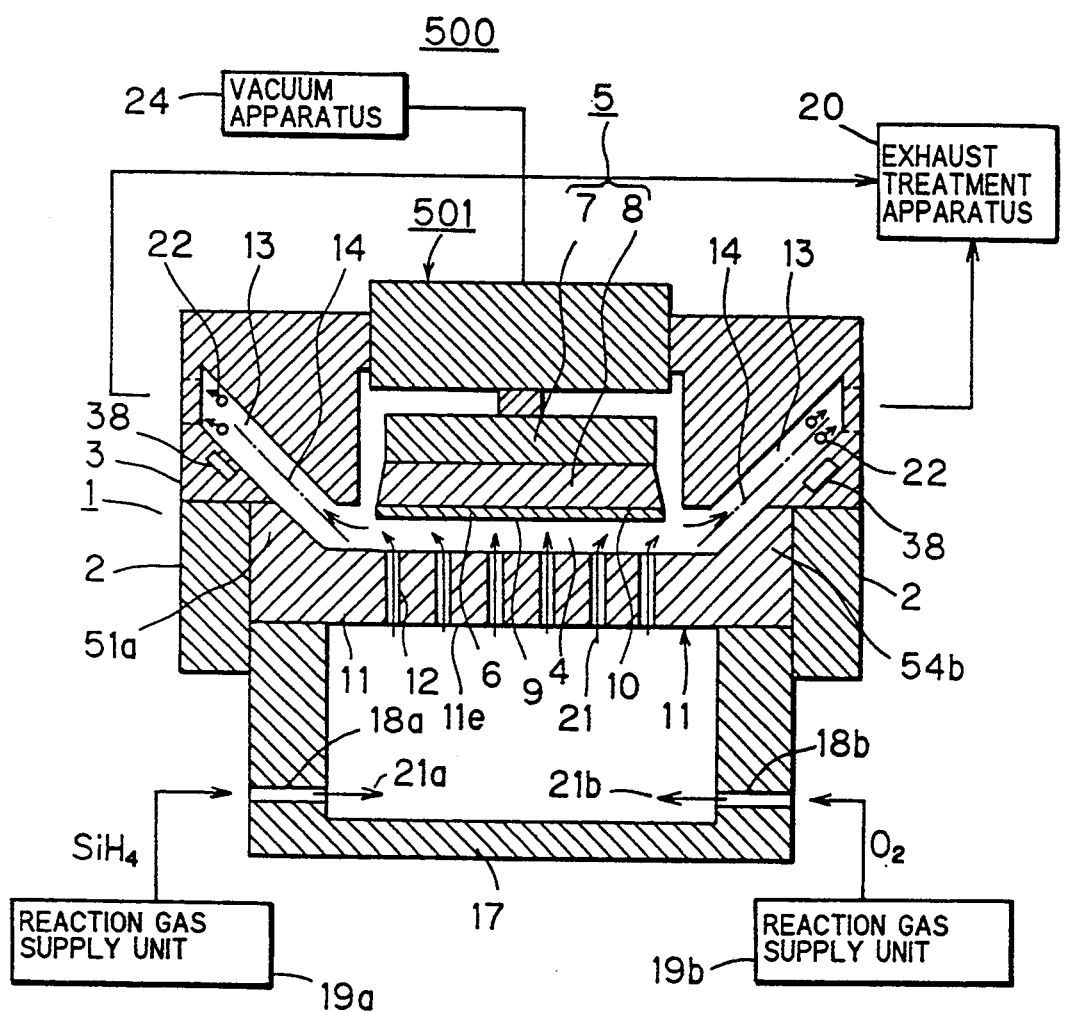
FIG. 16 is a front sectional view showing a normal-pressure CVD treatment system according to a fifth embodiment of the present invention.
Figure 17:
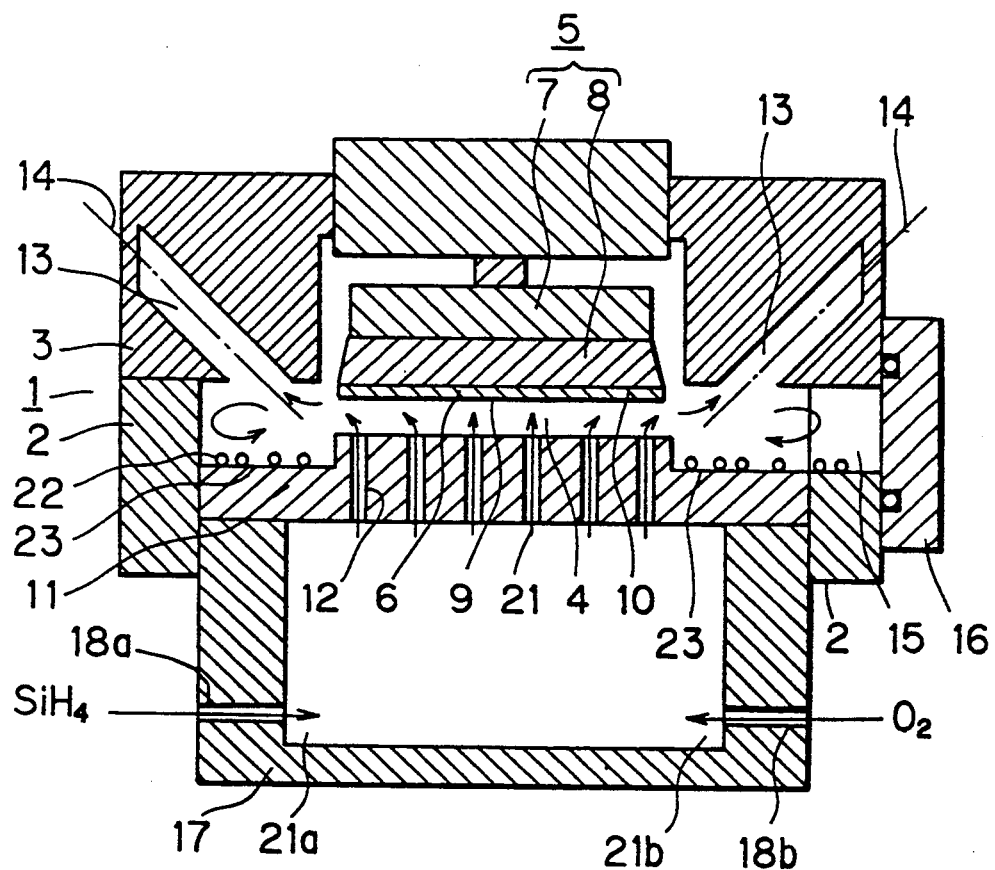
FIG. 17 is a front sectional view showing a principal part of a conventional normal-pressure CVD apparatus.

FIG. 16 is a front sectional view showing a normal-pressure CVD treatment system 500 according to a fifth embodiment of the present invention. In a normal-pressure CVD apparatus 501 employed in this system 500, a portion of a gas introduction plate 11 enclosing an arrangement of reaction gas introduction holes 12 is raised up in the form of a slant face, to serve as a rectification portion 51a. The upper surface of the rectification portion 51a connects the upper surface of a central portion 11e of the gas introduction plate 11 provided with the arrangement of the reaction gas injection holes 12 with the bottom surface of an exhaust passage 133 with no step.

Since the apparatus 501 is provided with no movable current plate, a reaction housing head portion 3 is raised up and separated from a reaction housing body 2 when a semiconductor substrate 6 is introduced into and discharged from the reaction space 4.

Modifications (1) Although the reaction gases 21a and 21b are prepared from silane and oxygen gases in the aforementioned embodiments, the present invention is also applicable to reaction gases other than silane and oxygen gases.

(2) A substrate to be provided with a CVD film according to the present invention is not restricted to the semiconductor substrate 6.

(3) The present invention is also applicable to a decompressed CVD apparatus.

While the invention has been shown and described in detail, the foregoing description is in all aspects illustrative and not restrictive. It is therefore understood that numerous modifications and variations can be devised without departing from the scope of the invention.

I claim:

1. A chemical vapor deposition treatment system for forming a film having a prescribed composition on a major surface of a substrate to be treated, said chemical vapor deposition treatment system comprising:
    (a) substrate support means for supporting said substrate while heating the same;
    (b) a reaction housing receiving said substrate and said substrate support means, said reaction housing defining a reaction space facing said major surface, and being provided with an exhaust passage communicating with said reaction space;
    (c) reaction gas introduction means facing said major surface of said substrate and having a reaction gas introduction hole being opened toward said major surface of said substrate;
    (d) inert gas introduction means being provided around said reaction gas introduction means and having an inert gas injection hole being opened toward said exhaust passage;
    (e) reaction gas supply means being coupled to said reaction gas introduction means for supplying a reaction gas into said reaction space from said reaction gas introduction hole;
    (f) inert gas supply means being coupled to said inert gas introduction means for injecting an inert gas toward said exhaust passage through said inert gas injection hole; and (g) exhaust means being coupled to said exhaust passage for discharging an exhaust gas resulting from said reaction gas and said inert gas through said exhaust passage, wherein:

said inert gas injection hole is opened toward said exhaust passage in a boundary between said reaction space and said exhaust passage; and said reaction housing comprises:

(b-1) a tapered wall surface having a circle enclosing a periphery of said reaction space as a lower edge and gradually spreading from said gas introduction hole along a direction away from said major surface, and said exhaust passage is provided along said tapered wall surface.

2. A chemical vapor deposition treatment system in accordance with claim 1, wherein:

said inert gas supply means comprises:

(f-1) inert gas generation means for generating a pressurized inert gas; and (f-2) mass flow control means being interposed between said inert gas generation means and said inert gas introduction means for controlling the flow rate of said pressurized inert gas and supplying the same to said inert gas introduction means.

3. A chemical vapor deposition treatment system in accordance with claim 1, wherein:

said reaction gas introduction means comprises:

(c-1) a disk member being arranged in parallel with said major surface and provided with said reaction gas introduction hole;

said inert gas introduction means comprises:

(d-1) a flange member being integrated with said disk member for enclosing the periphery of said disk member and provided therein with a guide hole for guiding said inert gas; and (d-2) a hollow ring being arranged on said flange member to enclose the periphery of said flange member and having a hollow space communicating with said guide hole; and said inert gas injection hole is provided in said hollow ring to communicate with said hollow space.

4. A chemical vapor deposition treatment system in accordance with claim 3, wherein:

a plurality of inert gas injection holes respectively communicating with said hollow space are formed along the circumferential direction of said hollow ring substantially at regular intervals.

5. A chemical vapor deposition treatment system in accordance with claim 4, wherein:

respective ones of said plurality of inert gas injection holes are substantially in the form of circular holes.

6. A chemical vapor deposition treatment system in accordance with claim 4, wherein:

respective ones of said plurality of inert gas injection holes are substantially in the form of slit holes.

7. A chemical vapor deposition treatment system in accordance with claim 3, wherein:

said inert gas injection hole is a circular slit being formed along the circumferential direction of said hollow ring.

8. A chemical vapor deposition treatment system in accordance with claim 1, wherein:

said substrate support means comprises:

(a-1) means for supporting said substrate to downwardly direct said major surface;

said inert gas is a first inert gas;

said inert gas supply means is a first inert gas supply means; and said reaction housing is provided therein with an inert gas introduction passage for injecting a second inert gas into said reaction housing from about a side portion of said major surface toward said boundary between said reaction space and said exhaust passage;

said treatment system further comprising:

(h) second inert gas supply means being coupled to said inlet gas introducing passage in an exterior of said reaction housing for supplying said second inert gas into said inert gas introduction passage.

9. A chemical vapor deposition treatment system in accordance with claim 8, wherein:

said mass flow control means is a first mass flow control means;

a first part of said pressurized inert gas is supplied to said first mass flow control means; and said second inert gas supply means further comprises:

(h-1) second mass flow control means being interposed between said inert gas generation means and said inert gas introduction passage for receiving a second part of said pressurized inert gas while controlling the flow rate of said second part of said pressurized inert gas and supplying the same to said inert gas introduction passage as a second inert gas.

10. A chemical vapor deposition treatment system in accordance with claim 9, wherein:

said first and second mass flow control means are capable of setting the respective flow rates of said first and second parts of said pressurized inert gas at values being different from each other.

11. A chemical vapor deposition treatment system in accordance with claim 10, wherein:

(i) heating means being arranged in proximity to said exhaust passage for heating an inner wall surface of said reaction housing defining said exhaust passage.

12. A chemical vapor deposition apparatus for forming a film having a prescribed composition on a major surface of a substrate to be treated, said chemical vapor deposition apparatus comprising:

(a) substrate support means for supporting said substrate while heating the same;

(b) a reaction housing receiving said substrate and said substrate support means, said reaction housing defining a reaction space facing said major surface, and being provided with an exhaust passage communicating with said reaction space;

(c) reaction gas introduction means facing said major surface of said substrate and having a reaction gas introduction hole being opened toward said major surface of said substrate; and (d) inert gas introduction means being provided around said reaction gas introduction means and having an inert gas injection hole being opened toward said exhaust passage;

wherein:

said reaction housing comprises:

(b-1) a tapered wall surface having a circle enclosing a periphery of said reaction space as a lower edge and gradually spreading from said gas introduction hole along a direction away from said major surface, and said exhaust passage is provided along said tapered wall surface.

13. A chemical vapor deposition treatment system for forming a film having a prescribed composition on a major surface of a substrate to be treated, said chemical vapor deposition treatment system comprising:

(a) substrate support means for supporting said substrate while heating the same;

(b) a reaction housing receiving said substrate and said substrate support means, said reaction housing defining a reaction space facing said major surface, and being provided with an exhaust passage communicating with said reaction space;

(c) reaction gas introduction means facing said major surface of said substrate and having a reaction gas introduction hole being opened toward said major surface of said substrate;

(d) rectification means being provided in said reaction housing and having a wall surface for converting a flow of an exhaust gas resulting from said reaction gas from said reaction space to said exhaust passage to a laminar flow;

(e) reaction gas supply means being coupled to said reaction gas introduction hole for supplying a reaction gas into said reaction space from said reaction gas introduction hole; and (f) exhaust means being coupled to said exhaust passage for discharging said exhaust gas through said exhaust passage.

14. A chemical vapor deposition treatment system in accordance with claim 13, wherein:

said reaction housing is provided on a part thereof with a substrate carrier passage communicating with said reaction space for introducing said substrate from the exterior of said reaction housing into said reaction housing and discharging said substrate from the interior of said reaction housing to said exterior;

said substrate carrier passage has:

a first opening being opened in the interior of said reaction housing; and a second opening being opened in said exterior of said reaction housing;

said rectification means comprises:

(d-1) a movable portion covering said first opening; and (d-2) a fixed portion being fixed around said gas introduction means in a position avoiding said first opening;

said treatment system further comprising:

(g) driving means being coupled to said movable portion for opening/closing said first opening by driving said movable portion.

15. A chemical vapor deposition treatment system in accordance with claim 14, wherein:

said reaction housing comprises:

(b-1) a wall surface enclosing said first opening; and said rectification means further comprises:

(d-3) sealing means being fixed to said movable portion for sealing a clearance between said movable portion and said wall surface when said movable portion closes said first opening.

16. A chemical vapor deposition treatment system in accordance with claim 15, wherein:

said reaction housing comprises:

(b-2) a tapered wall surface having a circle enclosing a periphery of said reaction space as a lower edge and gradually spreading from said gas introduction hole along a direction away from said major surface;

said exhaust passage is established along said tapered wall surface; and an exhaust intake of said exhaust passage is a ring-shaped opening enclosing the periphery of said reaction space.

17. A chemical vapor deposition treatment system in accordance with claim 16, wherein:

said first opening of said substrate carrier passage is provided in proximity to a first portion of said ring-shaped opening;

said movable portion is slidably provided in proximity to said first portion of said ring-shaped opening to be capable of opening/closing said first opening; and said fixed portion is provided in proximity to a second portion, other than said first portion, of said ring-shaped opening.

18. A chemical vapor deposition treatment system in accordance with claim 17, wherein:

said substrate support means comprises:

(a-1) means for supporting said substrate to downwardly direct said major surface; and said reaction housing is provided therein with an inert gas injection passage for injecting an inert gas into said reaction housing from above a side portion of said major surface toward a boundary between said reaction space and said exhaust passage;

said treatment system further comprising:

(h) inert gas supply means being coupled to said inert gas injection passage for supplying said inert gas into said inert gas injection passage.

19. A chemical vapor deposition treatment system in accordance with claim 18, wherein:

said inert gas supply means comprises:

(h-1) inert gas generation means for generating a pressurized inert gas; and (h-2) mass flow control means being interposed between said inert gas generation means and said inert gas injection means for controlling the flow rate of said pressurized inert gas and supplying the same to said inert gas injection means.

20. A chemical vapor deposition treatment system in accordance with claim 19, further comprising:

(i) heating means for heating an inner wall surface of said reaction housing defining said exhaust passage.

21. A chemical vapor deposition apparatus for forming a film having a prescribed composition on a major surface of a substrate to be treated, said chemical vapor deposition apparatus comprising:

(a) substrate support means for supporting said substrate while heating the same;

(b) a reaction housing receiving said substrate and said substrate support means, said reaction housing defining a reaction space facing said major surface, and being provided with an exhaust passage communicating with said reaction space;

(c) gas introduction means facing said major surface of said substrate and having a reaction gas introduction hole being opened toward said surface of said substrate; and (d) rectification means being provided in said reaction housing for converting a flow of an exhaust gas result from said reaction gas from said reaction space to said exhaust passage to a laminar flow.

* * * * *